(12) United States Patent
Tang et al.

(10) Patent No.: US 10,795,751 B2
(45) Date of Patent: Oct. 6, 2020

(54) CELL-AWARE DIAGNOSTIC PATTERN GENERATION FOR LOGIC DIAGNOSIS

(71) Applicant: Mentor Graphics Corporation, Wilsonville, OR (US)

(72) Inventors: Huaxing Tang, Wilsonville, OR (US); Manish Sharma, Wilsonville, OR (US); Wu-Tung Cheng, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 233 days.

(21) Appl. No.: 15/884,372

(22) Filed: Jan. 30, 2018

(65) Prior Publication Data

US 2018/0253346 A1 Sep. 6, 2018

Related U.S. Application Data

(60) Provisional application No. 62/467,027, filed on Mar. 3, 2017.

(51) Int. Cl.
*G06F 11/07* (2006.01)
*G01R 31/28* (2006.01)
*G01R 31/3183* (2006.01)
*G06F 11/263* (2006.01)

(52) U.S. Cl.
CPC ........ *G06F 11/079* (2013.01); *G01R 31/2837* (2013.01); *G01R 31/2896* (2013.01); *G01R 31/318342* (2013.01); *G06F 11/0778* (2013.01); *G01R 31/287* (2013.01); *G06F 11/263* (2013.01)

(58) Field of Classification Search
CPC ..... G06F 11/07; G06F 11/079; G06F 11/0778

USPC ........................................................ 714/37
See application file for complete search history.

(56) References Cited

U.S. PATENT DOCUMENTS

| 8,527,232 B2 * | 9/2013 | Guo | G01R 31/318328 |
| | | | 702/117 |
| 8,875,077 B1 * | 10/2014 | O'Riordan | G06F 17/5036 |
| | | | 716/112 |
| 8,990,760 B2 | 3/2015 | Hapke et al. | |
| 2006/0053357 A1 * | 3/2006 | Rajski | G01R 31/01 |
| | | | 714/742 |
| 2008/0091998 A1 * | 4/2008 | Wang | G01R 31/318328 |
| | | | 714/729 |

(Continued)

OTHER PUBLICATIONS

Z. Wang, et al., "Multiple Fault Diagnosis using N-detection Tests", Proc. ICCD, 2003, pp. 198-201.

(Continued)

*Primary Examiner* — Kamini B Patel

(57) ABSTRACT

Various aspects of the disclosed technology relate to techniques of logic diagnosis based on cell-aware diagnostic pattern generation. A first diagnosis process is performed on a failed integrated circuit based on a first fail log to generate a first set of defect suspects. The first fail log is generated by applying the first set of test patterns to the failed integrated circuit in a first scan-based test. A second set of test patterns are generated using fault models for internal defects in one or more cells included in the first set of defect suspects. The second set of test patterns are applied to the failure integrated circuit to generate a second fail log. A second diagnosis process is performed on the failure integrated circuit based on the second fail log.

18 Claims, 7 Drawing Sheets

(56) References Cited

U.S. PATENT DOCUMENTS

| | | | |
|---|---|---|---|
| 2009/0113261 A1* | 4/2009 | Kajihara | G01R 31/318328 714/724 |
| 2009/0235134 A1* | 9/2009 | Guo | G01R 31/318544 714/726 |
| 2010/0229061 A1* | 9/2010 | Hapke | G01R 31/318342 714/740 |
| 2013/0054161 A1* | 2/2013 | Hapke | G01R 31/31835 702/59 |

OTHER PUBLICATIONS

K. Gearhardt, et al., "Improving Fault Isolation using Iterative Diagnosis", ISTFA, 2008, Paper 13.2.
J. Ghosh-Dastidar, et al, "Adaptive Techniques for Improving Delay Fault Diagnosis", VTS, 1999, pp. 168-172.
P. Camurati, et al., "A Diagnostic Test Pattern Generation Algorithm", Proc. ITC, 1990, pp. 52-58.
T. Bartenstein, "Fault Distinguishing Pattern Generation", in Proc. ITC, 2000, pp. 820-828.
N. Bhatti, R. D. Blanton, "Diagnostic Test Generation for Arbitrary Faults", Proc. ITC, 2006, paper 19.2.

\* cited by examiner

CELL-AWARE DIAGNOSTIC PATTERN GENERATION FOR LOGIC DIAGNOSIS

RELATED APPLICATIONS

This application claims the benefit of U.S. Provisional Patent Application No. 62/467,027, filed on Mar. 3, 2017, entitled "Cell-Aware Diagnostic Pattern Generation," and naming Huaxing Tang et al. as inventors, which application is incorporated entirely herein by reference.

FIELD OF THE DISCLOSED TECHNIQUES

The presently disclosed techniques relates to the field of circuit testing and defect diagnosis technology. Various implementations of the disclosed techniques may be particularly useful for increasing diagnosis resolution.

BACKGROUND OF THE DISCLOSED TECHNIQUES

Scan diagnosis has been widely used to determine likely defect locations for a given failing device. The diagnosis results can guide the physical failure analysis (PFA) to locate defects and to identify the root cause. Recently, advanced diagnostic techniques such as layout-aware diagnosis and cell internal diagnosis have helped failure analysis engineers to focus on much smaller areas, thereby improving the PFA success rate with a faster turnaround time and lower costs. However, the diagnosis resolution is still less than ideal in some cases even with the help of these advanced diagnostic algorithms, especially when the failure data are limited. This issue becomes worse for defects within complex cells that use FinFET (fin field-effect transistor) technologies. This is because their defect behaviors don't match well with traditional stuck-at faults and transition delay faults which are targeted during pattern generation. One example of such defects is the transistor stuck-open defect.

To improve diagnosis resolution, additional test patterns may be generated for distinguishing defect suspects determined based on the fail log generated by manufacture test patterns. These additional test patterns are often referred to as diagnostic patterns or diagnostic test patterns. To further increase diagnosis resolution, some even use an iterative flow for generating diagnostic patterns based on multi-detection of stuck-at faults for scan failures. These diagnostic pattern generation methods typically employ conventional fault models for generating manufacture test patterns: stuck-at faults or transition faults, or their variations. As noted above, the actual defect behavior may not match the stuck-at fault or transition fault models, especially for internal defects of complex cells. Simply employing conventional cell internal models may not suffice. It is thus desirable to develop new diagnostic pattern generation techniques for improving diagnosis resolution.

BRIEF SUMMARY OF THE DISCLOSED TECHNIQUES

Various aspects of the disclosed technology relate to techniques of logic diagnosis based on cell-aware diagnostic pattern generation. In one aspect, there is a method, executed by at least one processor of a computer, comprising: performing a first diagnosis process on a failed integrated circuit based on a first fail log, a first set of test patterns and a circuit design based on which the failed integrated circuit is fabricated to generate a first set of defect suspects, the first fail log generated by applying the first set of test patterns to the failed integrated circuit in a first scan-based test, the first set of defect suspects comprising one or more cells in the circuit design; generating a second set of test patterns using fault models for internal defects in the one or more cells, the second set of test patterns capable of detecting each of the fault models for internal defects in the one or more cells for at least a predetermined number of times; performing a second diagnosis process on the failure integrated circuit based on a second fail log, the second set of test patterns and the circuit design to generate a second set of defect suspects, the second fail log generated by applying the second set of test patterns to the failure integrated circuit in a second scan-based test; and reporting the second set of defect suspects.

Each of the first diagnosis process and the second diagnosis process may comprise failing test pattern simulations and passing test pattern simulations. The fault models for internal defects in the one or more cells may comprise models generated based on fault simulation, exhaustive fault models covering all possible one-cycle and two-cycle input combinations and all possible fault effect propagation scenarios at all outputs of a cell, or both. The generating a second set of test patterns may comprises: generating two-time-frame test patterns; and generating one-time-frame test patterns.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to techniques of logic diagnosis based on cell-aware diagnostic pattern generation. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate," "perform," and "report" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device.

Illustrative Operating Environment

Figure 1:
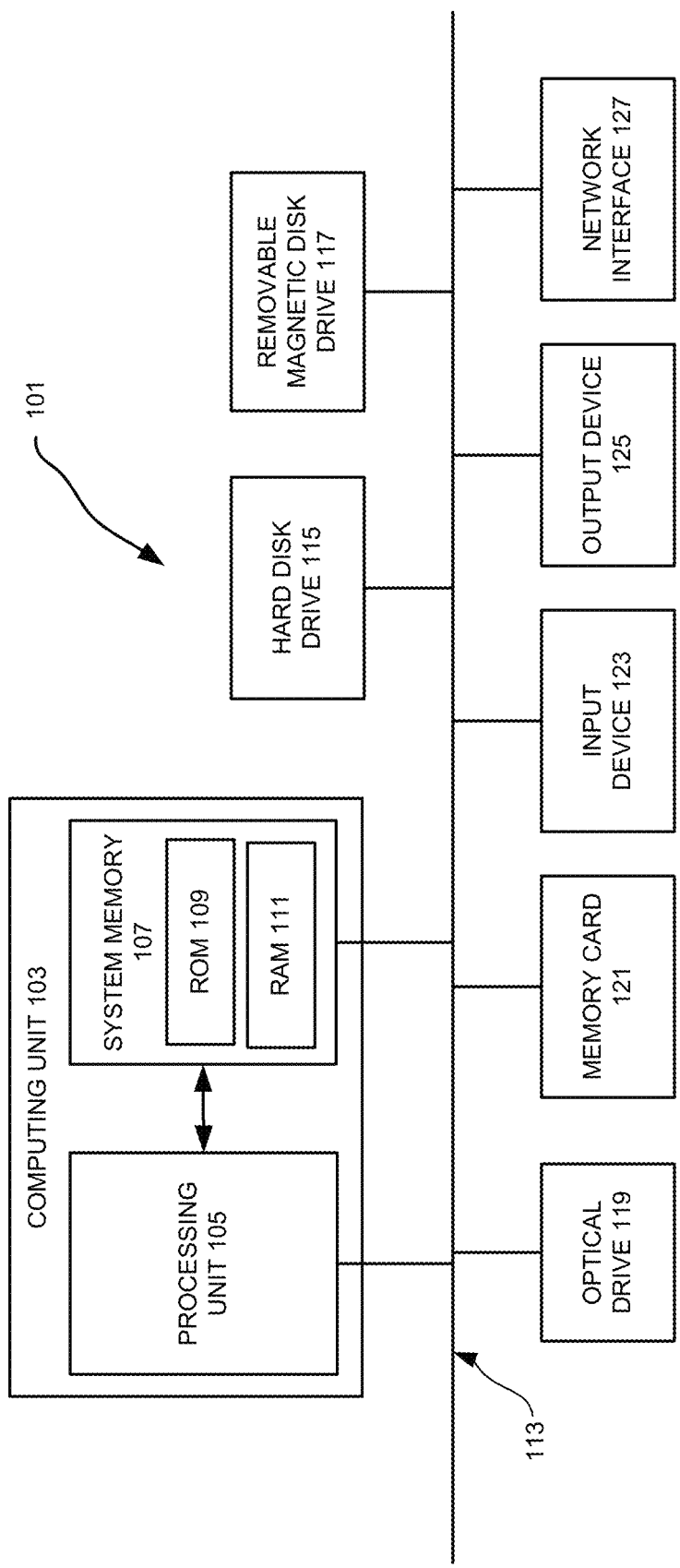
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design for Test, Test Pattern Generation, Scan-Based Test and Diagnosis

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. Scan elements and related clocking circuitry can take up about 30% of silicon area of an IC chip. It has been reported that scan chain failures account for almost 50% of chip failure in some cases. Chain diagnosis is thus important to guide physical failure analysis and yield learning process. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

All of the above mentioned processes, design insertion for testing, test pattern generation, test compression, and logic and chain diagnosis, are normally performed by various electronic design automation tools such as those in the Tessent family of software tools available from Mentor Graphics Corporation, Wilsonville, Oreg.

Logic Diagnosis Tool

Figure 2:
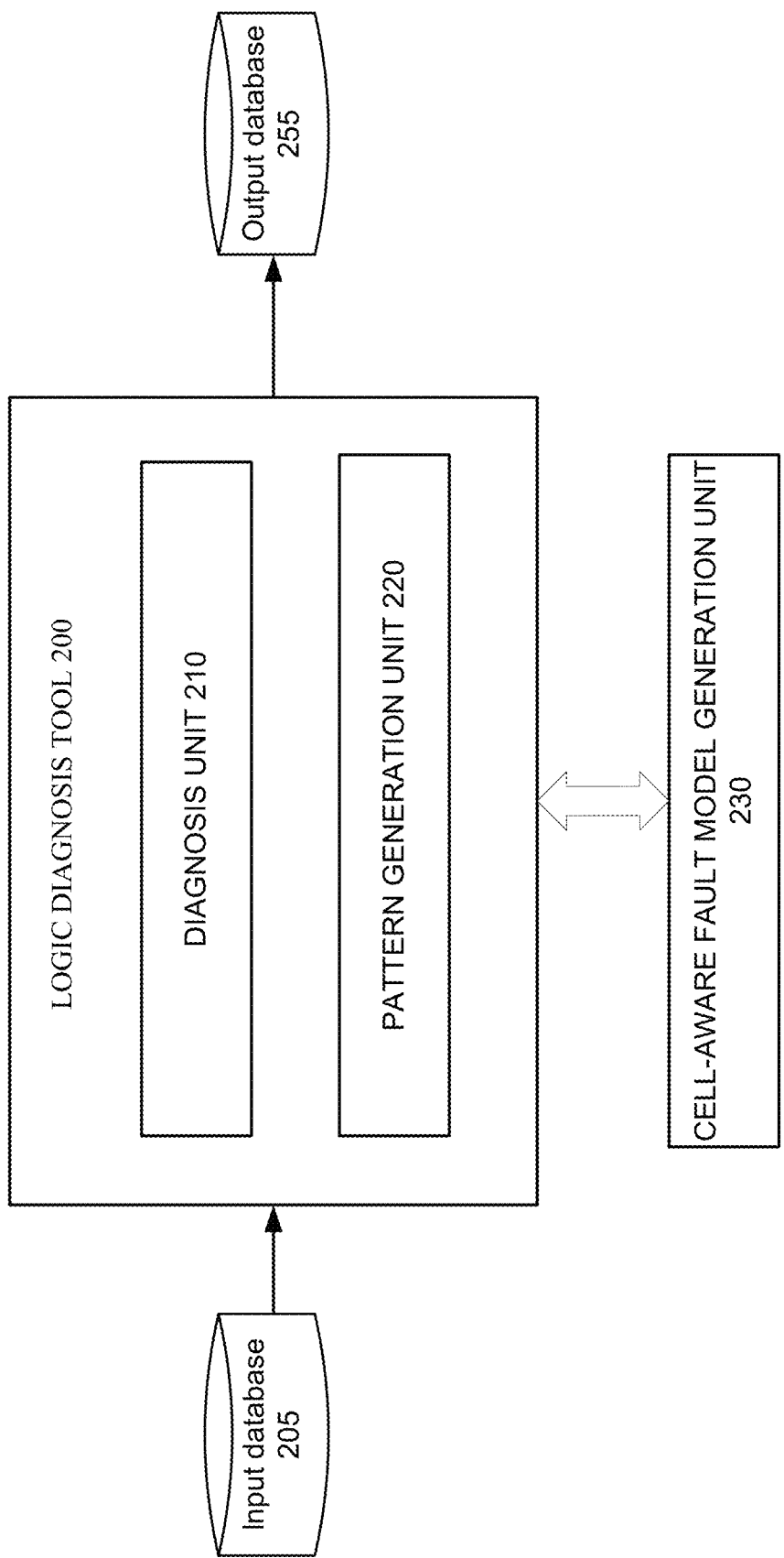
FIG. 2 illustrates an example of a logic diagnosis tool 200 that may be implemented according to according to various embodiments of the disclosed technology.
Figure 3:
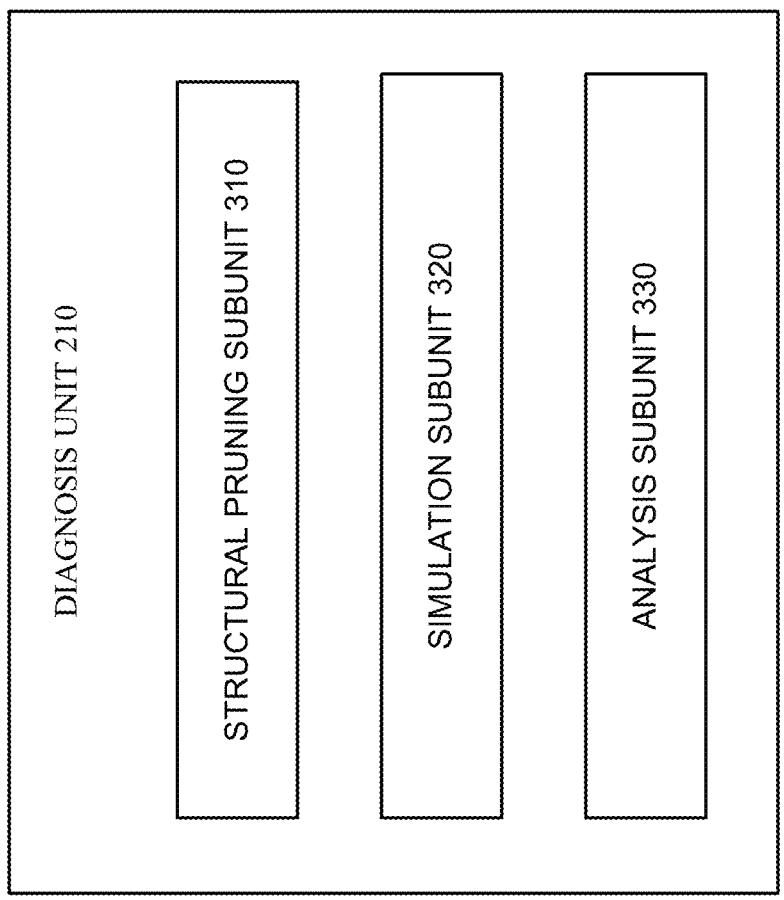
FIG. 3 illustrates an example of a diagnosis unit 210 in the logic diagnosis tool 200 that may be implemented according to according to various embodiments of the disclosed technology.

FIG. 2 illustrates an example of a logic diagnosis tool 200 that may be implemented according to various embodiments of the disclosed technology. As seen in this figure, the logic diagnosis tool 200 includes a diagnosis unit 210 and a pattern generation unit 220. Some implementations of the logic diagnosis tool 200 may cooperate with (or incorporate) one or more of a cell-aware fault model generation unit 230, an input database 205 and an output database 255. FIG. 3 illustrates an example of the diagnosis unit 210 that may be implemented according to various embodiments of the disclosed technology. The diagnosis unit 210 comprises a structural pruning subunit 310, a simulation subunit 320, and an analysis subunit 330.

As will be discussed in more detail below, the logic diagnosis tool 200 receives information of a circuit design, a first set of test patterns and test responses that are stored in the database 205. The test responses are obtained by applying the first set of test patterns to an integrated circuit manufactured based on the circuit design in a first scan-based test. The information of the test responses comprises information of failing bits and is contained in a first fail log. The diagnosis unit 210 performs a first diagnosis process on the failed integrated circuit based on the first fail log to generate a first set of defect suspects. The first set of defect suspects comprises one or more cells in the circuit design. The pattern generation unit 220 generates a second set of test patterns using fault models for the one or more cells. The fault models for the one or more cells may be generated by the cell-aware fault model generation unit 230. The second set of test patterns can detect each of the fault models for the one or more cells for at least a predetermined number of times. The diagnosis unit 210 performs a second diagnosis process on the failed integrated circuit based on the second fail log to generate a second set of defect suspects. The second fail log is generated by applying the second set of test patterns to the failure integrated circuit in a second scan-based test. The logic diagnosis tool 200 may store the second set of defect suspects in the output database 255.

As also will be discussed in more detail below, the structural pruning subunit 310 can perform path-tracing from failing bits recorded in the first or second fail log into the circuit design to determine defect candidates. The simulation subunit 320 can perform failing/passing test pattern simulations based on fault models for the defect candidates to determine defect suspects. The analysis subunit 330 can rank the defect suspects based on the simulation results.

As previously noted, various examples of the disclosed technology may be implemented by one or more computing systems, such as the computing system illustrated in FIG. 1. Accordingly, one or more of the diagnosis unit 210, the pattern generation unit 220 and the cell-aware fault model generation unit 230 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the diagnosis unit 210, the pattern generation unit 220 and the cell-aware fault model generation unit 230. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the diagnosis unit 210, the pattern generation unit 220 and the cell-aware fault model generation unit 230 are shown as separate units in FIG. 2, a single computer (or a single processor within a master computer) or a single computer system may be used to implement all of these units at different times, or components of these units at different times.

With various examples of the disclosed technology, the input database 205 and the output database 255 may be implemented using any suitable computer readable storage device. That is, either of the input database 205 and the output database 255 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices.

The computer readable storage devices may also include magnetic cassettes, magnetic tapes, magnetic disks or other magnetic storage devices, holographic storage devices, or any other non-transitory storage medium that can be used to store desired information. While the input database 205 and the output database 255 are shown as separate units in FIG. 2, a single data storage medium may be used to implement some or all of these databases.

Logic Diagnosis Based on Cell-Aware Diagnostic Pattern Generation

Figure 4:
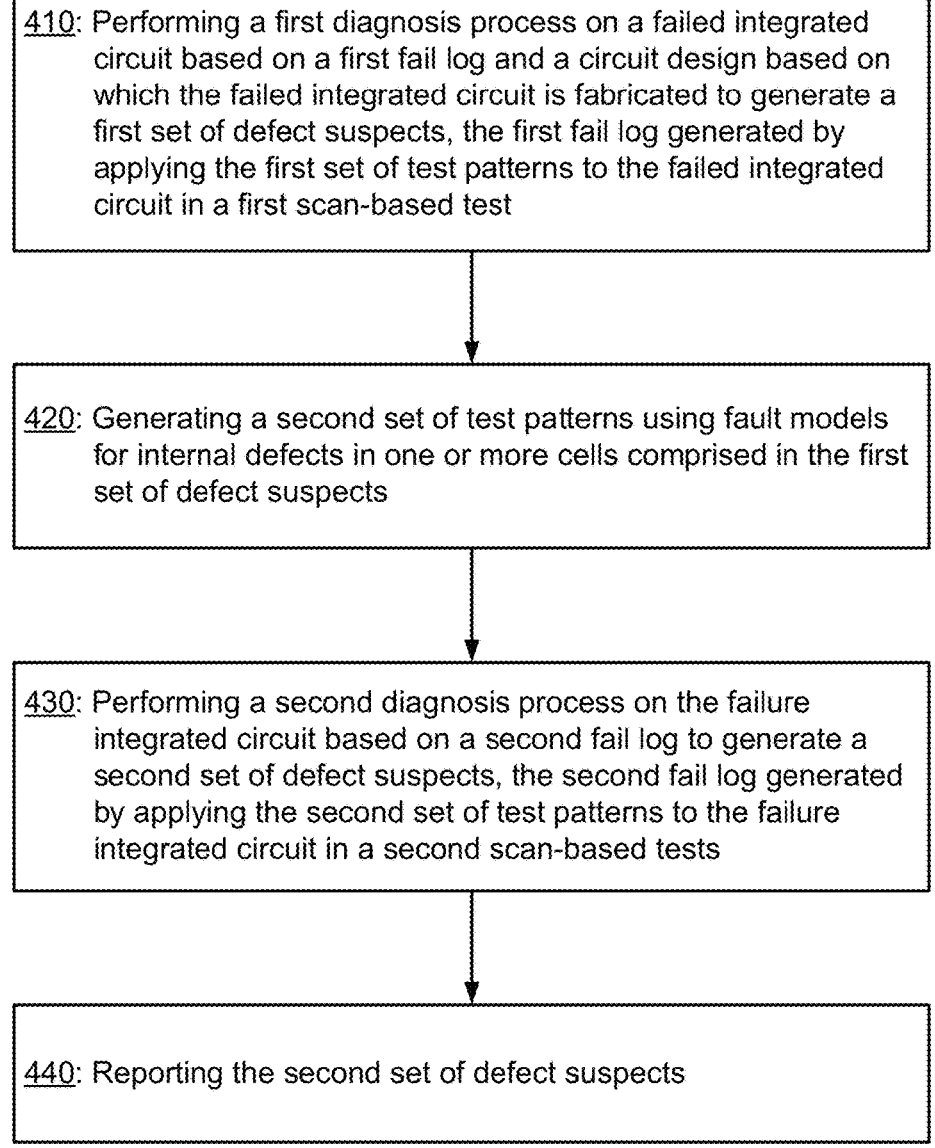
FIG. 4 illustrates a flowchart 400 showing a process of logic diagnosis based on cell-aware diagnostic pattern generation that may be implemented according to various examples of the disclosed technology.

FIG. 4 illustrates a flowchart 400 showing a process of logic diagnosis based on cell-aware diagnostic pattern generation that may be implemented according to various examples of the disclosed technology. For ease of understanding, methods of logic diagnosis based on cell-aware diagnostic pattern generation that may be employed according to various embodiments of the disclosed technology will be described with reference to the logic diagnosis tool 200 illustrated in FIG. 2 and the flow chart 400 in FIG. 4. It should be appreciated, however, that alternate implementations of a logic diagnosis tool may be used to perform the method of logic diagnosis based on cell-aware diagnostic pattern generation in the flow chart 400 according to various embodiments of the disclosed technology. In addition, it should be appreciated that implementations of the logic diagnosis tool 200 may be employed to implement methods of logic diagnosis based on cell-aware diagnostic pattern generation according to different embodiments of the disclosed technology other than the one illustrated by the flow chart 400 in FIG. 4.

In operation 410, the diagnosis unit 210 performs a first diagnosis process on a failed integrated circuit based on a first fail log, a first set of test patterns and a circuit design based on which the failed integrated circuit is fabricated to generate a first set of defect suspects. The first fail log is generated by applying the first set of test patterns to the failed integrated circuit in a first scan-based test. The first set of test patterns is typically a set of manufacture test patterns generated by an ATPG process for testing chips. The initial defect suspects comprise one or more cells in the circuit design. In the present disclosure, a cell is a standard cell from a standard cell library.

In designing application-specific integrated circuits (ASICs) with mostly digital-logic features, a standard cell library is usually used. The standard cell library comprises pre-defined digital building blocks—standard cells. A standard cell is a group of transistor and interconnect structures that provides a boolean logic function (e.g., primitive gates such as NOT, NAND, and NOR gates, complex cells such as 2-bit full adder) or a storage function (flip-flop or latch). These standard cells have optimized layouts and are fully characterized for performance. They typically are of a fixed height, enabling them to be placed in rows and thus easing the process of automated digital layout. Standard cell libraries provide identical functional cells between process nodes, or between different process technologies, making cell-based circuits more scalable and portable.

Figure 5:
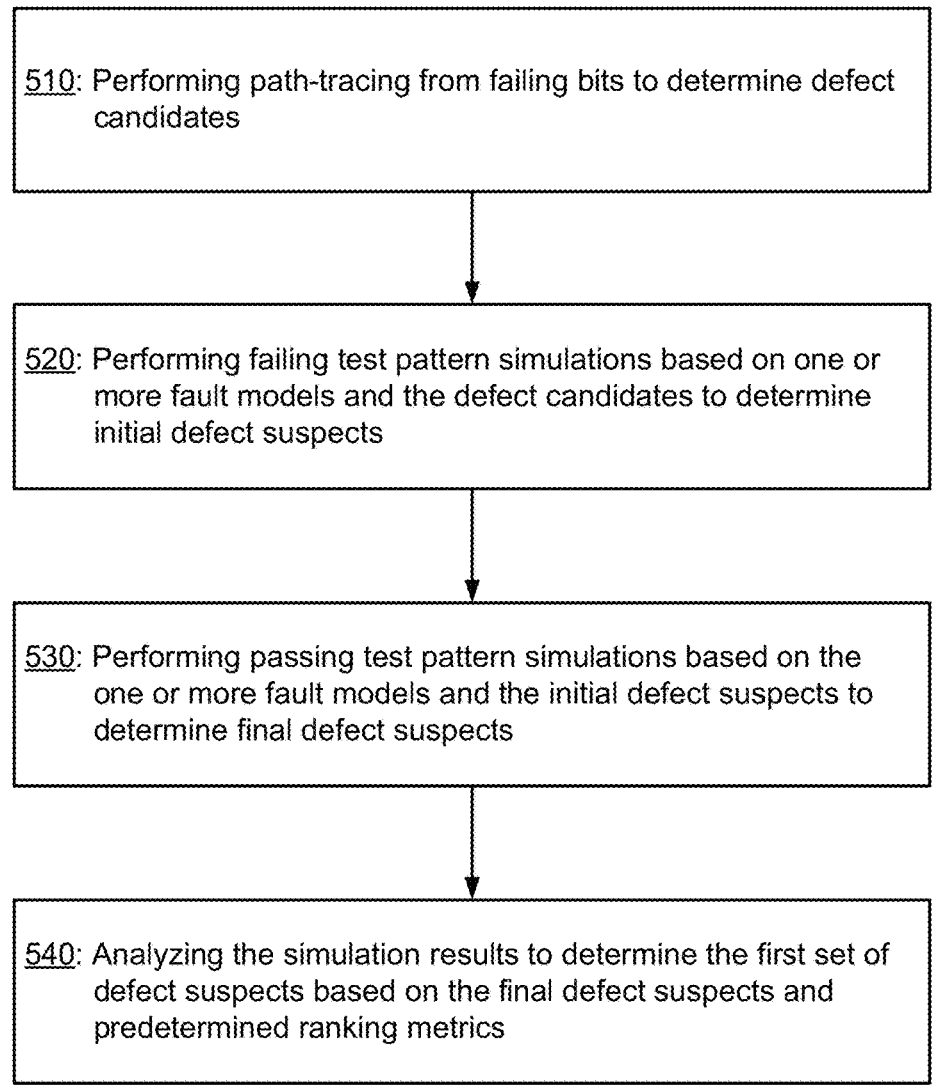
FIG. 5 illustrates a flowchart 500 showing a process of logic diagnosis that may be employed by the diagnosis unit 210.
Figure 5:

The first diagnosis process may be fault dictionary-based or syndrome examination-based. A syndrome examination-based diagnosis process that may be employed by the diagnosis unit 210 according to various embodiments of the disclosed technology is described with reference to the diagnosis unit 210 illustrated in FIG. 3 and a flow chart 500 illustrated in FIG. 5. In operation 510, the structural pruning subunit 310 determines defect candidates based on path-tracing from failing bits recorded in the first fail log into the circuit design. The path-tracing comprises probing from the scan cells/primary outputs that capture the failing bits into the circuit design. The backward path tracing traces along the sensitized paths obtained based on the good-circuit simulation results of the test patterns. The sensitized paths originated from a failing bit form a "cone". Cones for the failing bits of one test pattern may be processed such as determining intersection, union et al. to identify the defect candidate. The structural pruning subunit 310 can employ a commercial fault diagnosis tool to perform the path-tracing operation. An example of such an electronic design automation tool is the Tessent® Diagnosis software tool available from Mentor Graphics Corporation of Wilsonville, Oreg.

In operation 520, the simulation subunit 320 performs failing test pattern simulations based on one or more fault models and the defect candidates to determine initial defect suspects. The failing test pattern simulations are simulations using the test patterns that the failed integrated circuit generated test responses not matching good circuit responses during the first scan-based test. The one or more fault models can include conventional fault models and/or cell internal models. The conventional fault models may comprise stuck-at fault models. In this operation, the simulation subunit 320 may inject, for example, a stuck-at fault at the location of one of the defect candidates and simulate the failing test patterns to derive simulated test responses. It should be noted other types of fault models can be employed by the simulation subunit as well. The simulated test responses are then compared with the observed test responses. When matched, the defect candidate may be designated as an initial defect suspect. Layout information of the circuit design may be employed to reduce the number of the initial defect suspect. Again, the simulation subunit 320 may employ a commercial fault diagnosis tool to perform the failing test pattern operation.

In operation 530, the simulation subunit 320 performs passing test pattern simulations based on the one or more fault models and the initial defect suspects to determine final defect suspects. The passing test pattern simulations are simulations using the test patterns that the failed integrated circuit generated test responses matching good circuit responses during the first scan-based test. The simulation subunit 320 may inject, for example, a stuck-at fault at the location of one of the initial defect suspects and simulate the passing test patterns to derive simulated test responses. The simulated test responses are then compared with the observed test responses. When matched, the initial defect suspect may be designated as a final defect suspect.

In operation 540, the analysis subunit 330 analyzes the simulation results to determine the first set of defect suspects based on the final defect suspects. The analysis subunit 330 may calculate certain ranking metrics and rank the final defect suspects. The first set of defect suspects may be selected based on the rankings and some predetermined criteria.

Referring back to the flow chart 400 and the logic diagnosis tool 200, in operation 420, the pattern generation unit 220 generates a second set of test patterns using fault models for the one or more cells. The second set of test patterns may be referred to as diagnostic patterns or diagnostic test patterns. As noted previously, conventional stuck-at and transition fault models are not adequate for cell internal defects. For example, cell internal open defects are common cell internal defects due to the small feature size and high aspect ratio of vias for FinFET technologies. Such defects tend to behave like transistor stuck-open faults, which require completely different tests from traditional stuck-at and transition faults.

Figure 6:
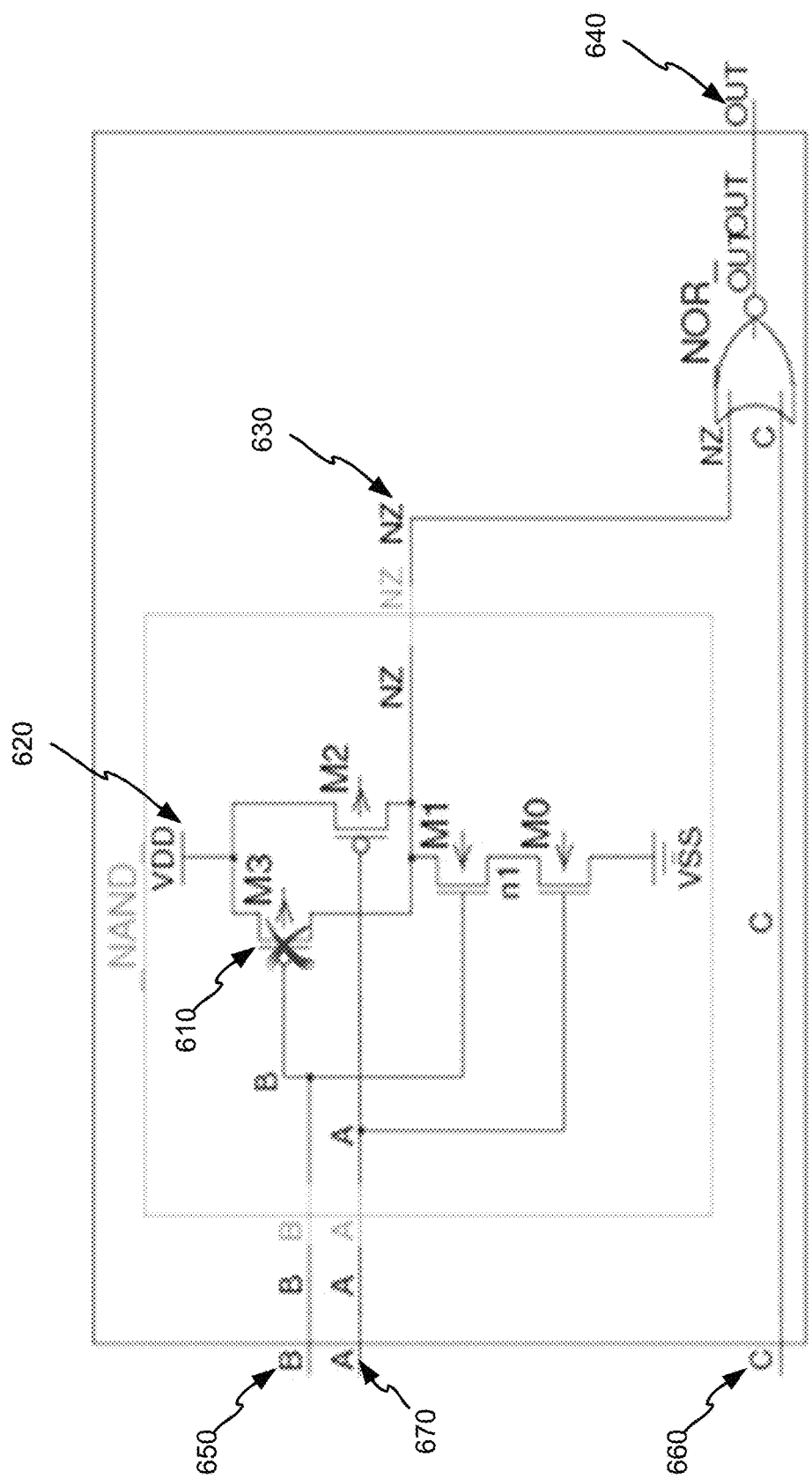
FIG. 6 illustrates an example of a transistor stuck-open fault in a NAND2 cell.

FIG. 6 illustrates a simple example of the transistor stuck-open fault in a NAND2 cell. Assume there is an open contact at a PMOS transistor 610 that cuts off the charging path from VDD 620, leading to a stuck-open fault. To reliably detect this open defect, two-vector tests are needed. The first vector pre-discharges the output NZ 630 to 0, and the second vector charges the output NZ 630 to 1 through the PMOS transistor 610. Due to the open contact, the second vector would fail to charge NZ 630 to 1, and NZ 630 would hold its previous state with a faulty value of 0. If this fault effect is successfully propagated from NZ 630 to an output 640 by C=0 (660), then this open contact defect will be detected. In other words, this stuck-open fault can only be reliably detected by the following two-vector patterns (A/B/C): 110-100 or 111-100.

The related stuck-at fault for this stuck-open fault is the input B (650) stuck-at 1, which can be activated by B=0 (650) and propagated to the output OUT (640) by the input A=1 (670) and the input C=0 (660). However, test patterns generated based on the vector pattern 100 may not be sufficient to detect the stuck-open fault because the initialization condition is not justified by ATPG and may not be satisfied. For real industrial scan based designs, the initialization condition for a transistor stuck-open fault may be accidentally satisfied during the last shift cycle, and thus fortuitous detections of stuck-open faults by one-cycle stuck-at patterns is possible.

ATPG using transition faults first tries to create a proper transition at the targeted fault site and then tries to propagate the fault effect to some observation points in the second cycle. For this example, the related transition fault for the stuck-open fault is the input B (650) slow-to-fall. Based on the transition fault definition, ATPG will first create a falling transition at the input B (650) by assigning it to 1 during the first cycle and to 0 during the second cycle. Due to the slow-to-fall fault, the input B (650) will have a fault value of 1 during the second cycle. ATPG will assign A=1 (670) and C=0 (660) to propagate this fault effect to the output OUT (640) for detection of this transition fault. The following patterns (A/B/C) are valid transition patterns for the input B (650) slow-to-fall fault: 110-100, 111-100, 010-100, 011-100. As we can see, only the first two patterns for this transition fault can reliably detect the stuck-open fault.

Figure 7:
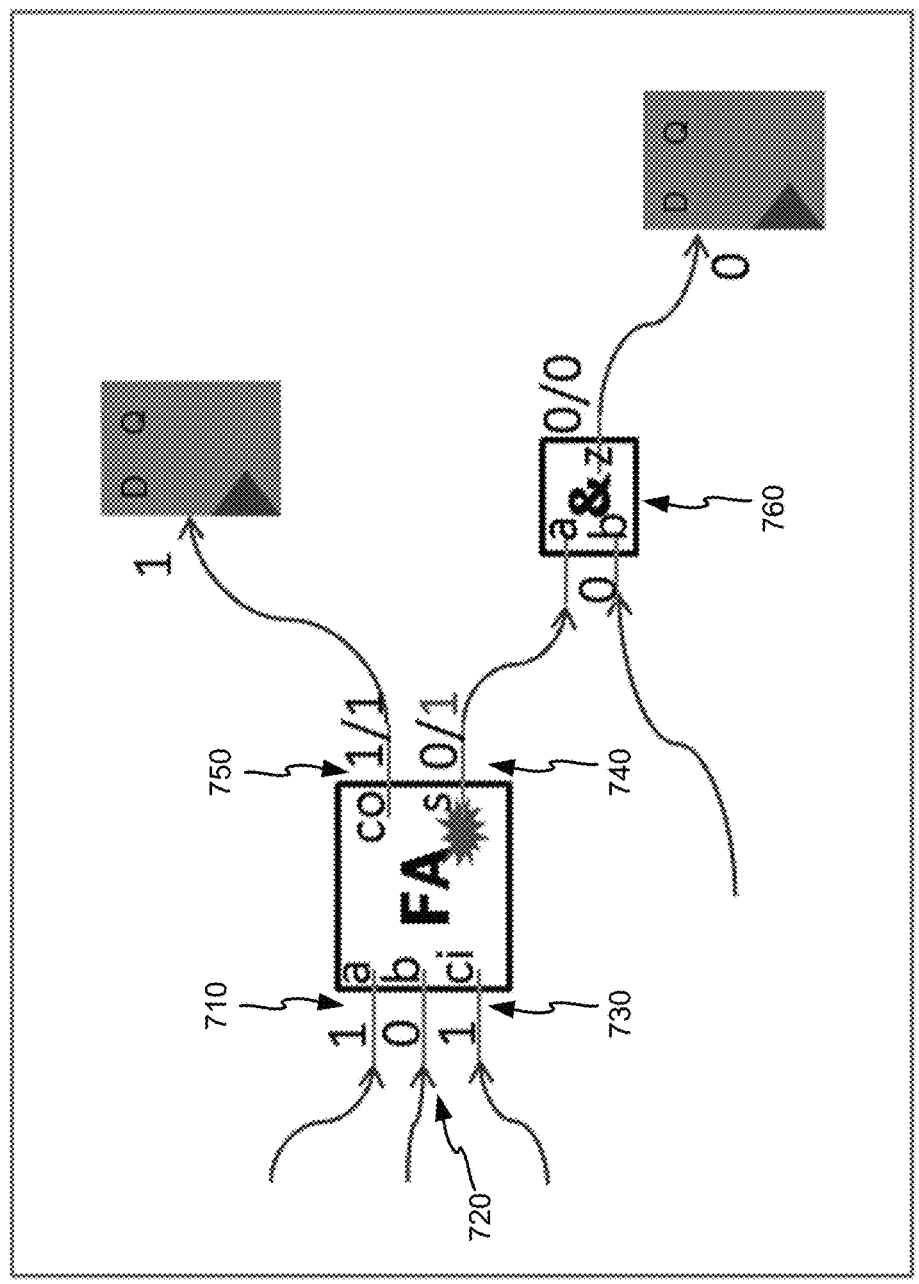
FIG. 7 illustrates an example of a full-adder which shows why a stuck-at-0 fault model should not be used to generate test patterns for detecting a cell-internal defect.

For complex cells with multiple outputs, like full-adders with two outputs, the diagnostic patterns generated based on input stuck-at faults simply assume that the fault effect can propagate to both of the outputs. This is untrue for some cell internal defects, resulting in invalid diagnostic patterns. A simple example is shown in FIG. 7. For a stuck-at 0 fault at the input 710, traditional diagnostic ATPG may generate a pattern with a=1 (710), b=0 (720), ci=1 (730), which can propagate the fault effect to both outputs and cause s=0/1 (740) and co=1/0 (750). Let's assume that the fault effect s=0/1 (740) is blocked by an AND gate 760 and the fault effect co=1/0 (750) successfully reaches some observation points for a given pattern. In this case, the pattern is considered valid for fault a stuck-at 0. However for complex cells with multiple outputs, some cell internal defects may affect one output only. In this case, if one defect can be activated by a=1 (710), b=0 (720), ci=1 (730) but can only propagate the fault effect to output s (740) as 0/1, then this pattern will not be able to detect this defect because of the blocked propagation path for fault effect s=0/1, as shown in FIG. 7. To ensure the detection of such defects, diagnostic ATPG needs to use accurate fault models to take the fault effect propagation into consideration, so that the fault effect is properly observed.

In addition to test patterns generated based on the stuck-at and transition faults, gate exhaustive test patterns also have limitations for detecting cell internal defects. A set of gate exhaustive test patterns apply all possible input combinations to each gate and observes the gate response at an observation point. When targeting a defect within a complex cell with multiple outputs, it may observe the response from an output unaffected by this defect and thus fail to detect this defect.

According to some embodiments of the disclosed technology, the cell-aware fault model generation unit 230 may generate the fault models for internal defects by injecting a fault inside a cell and the determine values at inputs/outputs of the cell that can detect the injected fault. Alternatively or additionally, the cell-aware fault model generation unit 230 may inject a defect at a possible location and perform a SPICE simulation to determine the fault model. According to some other embodiments of the disclosed technology, the cell-aware fault model generation unit 230 may create exhaustive fault models as the fault models for internal defects. A set of exhaustive fault models cover all possible one-cycle and two-cycle input combinations and all possible fault effect propagation scenarios at all cell outputs. For example, a full adder cell with 3 inputs (a/b/ci) and 2 outputs (s/co). First, consider ltime-frame tests. There is a total of $2^3=8$ unique input combinations for this full adder. Since there are two outputs, for each test, we have $2^2-1=3$ fault effect propagation scenarios. Considering all input combinations, a full adder cell will have $2^3*3=24$ faults for all possible one-time-frame tests, and $2^3*2^3*3=192$ faults to cover all possible two-time-frame tests. The cell-aware fault model generation unit 230 may use the exhaustive fault models for some cells (e.g., cells having small numbers of ports) and the fault models derived using other methods for the rest of the cells.

Using the fault models generated by the cell-aware fault model generation unit 230, the pattern generation unit 220 may employ iterative ATPG to generate diagnostic patterns in two phases. In the first phase, all of the fault models with two time frame (2TF) tests are targeted and sequential patterns with two or more cycles are generated to detect and differentiate these faults. The process will be repeated for a user-defined number of times to ensure that sufficient failure data can be obtained during retesting. Afterwards, the faults with one time frame (1TF) tests will be targeted to generate basic patterns with one cycle. Similarly, the iterative pattern generation is used to ensure sufficient detections—the second set of test patterns are capable of detecting each of the fault models for internal defects in the one or more cells for at least a predetermined number of times. For a fault model with more than one test pattern, the test pattern that detects fewer faults may be given higher priority during pattern generation to increase the probability of differentiating these faults.

Both the pattern generation unit 220 and the cell-aware fault model generation unit 230 can be implemented by those in the Tessent family of software tools available from Mentor Graphics Corporation, Wilsonville, Oreg.

Referring back to the flow chart 400, in operation 430, the diagnosis unit 210 performs a second diagnosis process on the failure integrated circuit based on a second fail log to generate a second set of defect suspects. The second fail log is generated by applying the second set of test patterns to the failure integrated circuit in a second scan-based test. The second scan-based test may be performed by the same tester used in the first scan-based test. The operation 430 may be performed similar to the operation 410. In operation 440, the logic diagnosis tool 200 reports the second set of defect suspects. The reporting may comprise storing in the output database 255 and/or displaying the second set of defect suspects.

The method according to some embodiment of the disclosed technology has been applied to a real mobile platform based system-on-chip (SoC) of 5.3 million flip-flops with more than 150 clock-domains. This SoC had more than 50 compression integrated cores for which vector generation was done independently in a normal flow. Since few cores were not utilizing the scan bus bandwidth optimally due to small size of cores hence targeting much lesser compression. To achieve optimized compression, all of the cores were implemented with concurrent scan mode (dual compression mode) in which same core can operate with lesser number of scan IOs without changing scan chain length. Using lesser number of scan IOs for a core allows other cores to use those reduced channel. Hence allowing multiple cores to be operated simultaneously for scan testing. This mode is called concurrent scan mode in which multiple cores are running scan tests concurrently. Default mode of operation where only one core is being operated is called default mode.

Concurrent scan being a new methodology to be employed in the SoC for the first time, had to be ensured to have no DPPM impact with test time improvement. Hence SoC generated full set vectors for both default and concurrent scan mode and included them in the production test suite. But production silicon data showed that there were some unique failures with default mode of operation although SAF coverage reported by both default and concurrent mode was same. There was unique DPPM fallout of ~40 with default mode hence concurrent scan vectors would have caused test escapes. It was important to analyze this kind of defects not getting screened by new set of vectors to identify the fix required in the methodology.

There were total 4 devices manufactured by a 14 nm FinFET process which were selected for this analysis for which normal diagnosis results were collected from Test Diagnosis.

All the diagnosed nodes for each device, ranging from 8 to 143, were checked for stuck-at fault detection. There was 100% correlation between concurrent scan and default mode. And all of them were detected under both modes.

Based on normal diagnosis it was clear that there are some unique cell internal faults which are being covered in default mode but not in concurrent scan mode. Hence further diagnosis analysis of defects was done using new cell aware diagnostic pattern generation methodology.

The experiment setup was fairly straight-forward: for each die, regular diagnosis was first used to generate the original report based on the limited failure data from the production stuck-at patterns. Then the cell aware diagnostic pattern generation was used to generate new patterns based on the original diagnosis report. The newly generated cell aware diagnostic patterns were re-applied to this device, and failure data was collected and diagnosed to obtain the improved diagnosis report. For easy comparison, the same non-cell-aware diagnosis setup was used for both diagnosis runs. The same experiment was repeated for a traditional method for comparison. To maximize the diagnosis resolution, a set of exhaustive fault models file was used. Since the number of targeted cells for each case was typically small, the pattern generation time and pattern count were reasonable. For each case, it took no more than 4 hours to generate less than 3000 patterns.

Experiment results for these 4 devices are reported in Table 1. The first column is case ID. The number of failing patterns and the number of suspects in original diagnosis reports for production stuck-at patterns are listed in column 2 and 3. The number of failing patterns and the number of suspects in new diagnosis reports for cell aware diagnostic patterns are reported in column 4 and 5. Column 6 reports the resolution improvement which is calculated by dividing the number of suspects from original report by the number of suspects from the new report. Similarly, the number of failing patterns, the number of diagnosis suspects, and the resolution improvement are reported in columns 7-9. The average values for each column are reported in the last row except for last 3 columns whose data is incomplete.

TABLE 1

| | SA Patterns | | Disclosed method | | | A traditional method | | |
|---|---|---|---|---|---|---|---|---|
| Case | #FP | #Sus | #FP | #Sus | RI | #FP | #Sus | RI |
| 1 | 1 | 3 | 80 | 1 | 3 | 10 | 3 | 1 |
| 2 | 1 | 8 | 51 | 4 | 2 | 0 | 0 | 0 |
| 3 | 4 | 93 | 42 | 2 | 46.5 | n/a | n/a | n/a |
| 4 | 3 | 24 | 29 | 3 | 8 | n/a | n/a | n/a |
| Avg | 2.25 | 32 | 50.5 | 2.5 | 14.9 | n/a | n/a | n/a |

The data shows that the disclosed method is far more effective; it detects the defect considerably more times, and results higher quality failure data. In case #1, only 1 original stuck-at pattern could detect the defect, but the new diagnostic patterns could detect this defect 80 times. This extra failure data reduces the number of suspects from 3 to 1, allowing the diagnosis algorithm to pinpoint a single cell. Furthermore, the proposed method dramatically improves cases where the original report has a poor resolution. In case #3, the original report spans a huge area of 93 suspects—impossible for PFA to process. With the help of cell-aware diagnostic patterns, the defect can be narrowed down to two neighboring cells, dramatically reducing the number of suspects by 46.5×, and making the PFA process possible for this device. On average, the proposed method increases the number of failing patterns by 22.4×, and reduces the number of suspects by 12.8×. The average resolution is improved by 14.9×.

Results for cases #1 and #2 clearly show that the traditional method is less effective for cell internal defects due to its various limitations described previously. For example, in case #1, even though the traditional diagnostic patterns detect this defect 10 times, little additional failure information can be extracted from these extra failing patterns by diagnosis, and thus no resolution improvement is achieved. In case #2, the diagnostic patterns can't even detect this defect and fails to improve diagnosis resolution. Almost all traditional diagnostic patterns are 1-cycle basic patterns, and would fail to detect this defect.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions, the computer-executable instructions, when executed, causing one or more processors to perform a method, the method comprising:

performing a first diagnosis process on a failed integrated circuit based on a first fail log, a first set of test patterns and a circuit design based on which the failed integrated circuit is fabricated to generate a first set of defect suspects that define one or more cells in the circuit design, thereby identifying one or more defective cells in the circuit design, wherein the first fail log is generated by applying the first set of test patterns to the failed integrated circuit in a first scan-based test, the first fail log including information describing when, where, and how a test failed and which of the first set of test patterns generate expected test responses;

based on identifying the one or more suspect defective cells, generating a second set of test patterns using fault models for internal defects in the one or more suspect defective cells, the second set of test patterns capable of detecting each of the fault models for internal defects in the one or more suspect defective cells for at least a predetermined number of times;

performing a second diagnosis process on the failure integrated circuit based on a second fail log, the second set of test patterns and the circuit design to generate a second set of defect suspects, the second fail log generated by applying the second set of test patterns to the failure integrated circuit in a second scan-based test; and reporting the second set of defect suspects.

2. The one or more non-transitory computer-readable media recited in claim 1, wherein each of the first diagnosis process and the second diagnosis process comprises failing test pattern simulations and passing test pattern simulations.

3. The one or more non-transitory computer-readable media recited in claim 1, wherein the fault models for internal defects in the one or more cells are generated based on fault simulation.

4. The one or more non-transitory computer-readable media recited in claim 1, wherein the fault models for internal defects in the one or more cells are exhaustive fault models covering all possible one-cycle and two-cycle input combinations and all possible fault effect propagation scenarios at all outputs of a cell.

5. The one or more non-transitory computer-readable media recited in claim 1, wherein the generating a second set of test patterns comprises:

generating two-time-frame test patterns; and generating one-time-frame test patterns.

6. The one or more non-transitory computer-readable media recited in claim 1, wherein the reporting comprises storing the second set of defect suspects.

7. A method, executed by at least one processor of a computer, comprising:

performing a first diagnosis process on a failed integrated circuit based on a first fail log, a first set of test patterns and a circuit design based on which the failed integrated circuit is fabricated to generate a first set of defect suspects that define one or more cells in the circuit design, thereby identifying one or more defective cells in the circuit design, wherein the first fail log is generated by applying the first set of test patterns to the failed integrated circuit in a first scan-based test, the first fail log including information describing when, where, and how a test failed and which of the first set of test patterns generate expected test responses;

based on identifying the one or more suspect defective cells, generating a second set of test patterns using fault models for internal defects in the one or more suspect defective cells, the second set of test patterns capable of detecting each of the fault models for internal defects in the one or more suspect defective cells for at least a predetermined number of times;

performing a second diagnosis process on the failure integrated circuit based on a second fail log, the second set of test patterns and the circuit design to generate a second set of defect suspects, the second fail log generated by applying the second set of test patterns to the failure integrated circuit in a second scan-based test; and reporting the second set of defect suspects.

8. The method recited in claim 7, wherein each of the first diagnosis process and the second diagnosis process comprises failing test pattern simulations and passing test pattern simulations.

9. The method recited in claim 7, wherein the fault models for internal defects in the one or more cells are generated based on fault simulation.

10. The method recited in claim 7, wherein the fault models for internal defects in the one or more cells are exhaustive fault models covering all possible one-cycle and two-cycle input combinations and all possible fault effect propagation scenarios at all outputs of a cell.

11. The method recited in claim 7, wherein the generating a second set of test patterns comprises: generating two-time-frame test patterns; and generating one-time-frame test patterns.

12. The method recited in claim 7, wherein the reporting comprises storing the second set of defect suspects.

13. A system comprising: one or more processors, the one or more processors programmed to perform a method, the method comprising:

performing a first diagnosis process on a failed integrated circuit based on a first fail log, a first set of test patterns and a circuit design based on which the failed integrated circuit is fabricated to generate a first set of defect suspects that define one or more cells in the circuit design, thereby identifying one or more defective cells in the circuit design, wherein the first fail log is generated by applying the first set of test patterns to the failed integrated circuit in a first scan-based test, the first fail log including information describing when, where, and how a test failed and which of the first set of test patterns generate expected test responses;

based on identifying the one or more suspect defective cells, generating a second set of test patterns using fault models for internal defects in the one or more suspect defective cells, the second set of test patterns capable of detecting each of the fault models for internal defects in the one or more suspect defective cells for at least a predetermined number of times;

performing a second diagnosis process on the failure integrated circuit based on a second fail log, the second set of test patterns and the circuit design to generate a second set of defect suspects, the second fail log generated by applying the second set of test patterns to the failure integrated circuit in a second scan-based test; and reporting the second set of defect suspects.

14. The system recited in claim 13, wherein each of the first diagnosis process and the second diagnosis process comprises failing test pattern simulations and passing test pattern simulations.

15. The system recited in claim 13, wherein the fault models for internal defects in the one or more cells are generated based on fault simulation.

16. The system recited in claim 13, wherein the fault models for internal defects in the one or more cells are exhaustive fault models covering all possible one-cycle and two-cycle input combinations and all possible fault effect propagation scenarios at all outputs of a cell.

17. The system recited in claim 13, wherein the generating a second set of test patterns comprises:
   generating two-time-frame test patterns; and
   generating one-time-frame test patterns.

18. The system recited in claim 13, wherein the post-layout verification process wherein the reporting comprises storing the second set of defect suspects.

* * * * *